(12) United States Patent
Marino et al.

(10) Patent No.: US 8,803,242 B2
(45) Date of Patent: Aug. 12, 2014

(54) HIGH MOBILITY ENHANCEMENT MODE FET

(75) Inventors: Fabio Alessio Marino, San Jose, CA (US); Paolo Menegoli, San Jose, CA (US)

(73) Assignee: Eta Semiconductor Inc., San Jose, CA (US)

( * ) Notice: Subject to any disclaimer, the term of this patent is extended or adjusted under 35 U.S.C. 154(b) by 0 days.

(21) Appl. No.: 13/200,083

(22) Filed: Sep. 19, 2011

(65) Prior Publication Data

US 2013/0069164 A1 Mar. 21, 2013

(51) Int. Cl.
| | | |
|---|---|---|
| *H01L 21/70* | (2006.01) | |
| *H01L 29/10* | (2006.01) | |
| *H01L 27/088* | (2006.01) | |
| *H01L 29/49* | (2006.01) | |
| *H01L 29/423* | (2006.01) | |
| *H01L 29/78* | (2006.01) | |
| *H01L 21/8234* | (2006.01) | |
| *H01L 29/66* | (2006.01) | |
| *H01L 29/51* | (2006.01) | |

(52) U.S. Cl.
CPC .......... *H01L 29/4916* (2013.01); *H01L 29/105* (2013.01); *H01L 29/66621* (2013.01); *H01L 29/66628* (2013.01); *H01L 27/0886* (2013.01); *H01L 29/4236* (2013.01); *H01L 29/1083* (2013.01); *H01L 29/7833* (2013.01); *H01L 21/823431* (2013.01); *H01L 29/7851* (2013.01); *H01L 29/517* (2013.01)
USPC ........................................... 257/369; 257/376

(58) Field of Classification Search
USPC .................................. 257/369, E29.254, 376
See application file for complete search history.

(56) References Cited

U.S. PATENT DOCUMENTS

| | | | | |
|---|---|---|---|---|
| 4,242,691 | A * | 12/1980 | Kotani et al. ................. | 257/327 |
| 5,289,027 | A | 2/1994 | Terril et al. | |
| 5,497,019 | A | 3/1996 | Mayer et al. | |
| 6,137,141 | A * | 10/2000 | Son et al. ...................... | 257/345 |
| 6,245,607 | B1 | 6/2001 | Tang et al. | |
| 6,413,802 | B1 | 7/2002 | Hu et al. | |
| 6,445,042 | B1 * | 9/2002 | Yu et al. ........................ | 257/369 |
| 6,744,103 | B2 * | 6/2004 | Snyder ......................... | 257/369 |
| 6,815,772 | B2 | 11/2004 | Takemura | |
| 6,882,009 | B2 * | 4/2005 | Ker et al. ...................... | 257/349 |
| 2002/0014633 | A1 * | 2/2002 | Ashley et al. ................ | 257/192 |
| 2003/0178633 | A1 * | 9/2003 | Flynn et al. ................... | 257/101 |
| 2004/0137673 | A1 * | 7/2004 | Passlack et al. .............. | 438/197 |
| 2005/0151174 | A1 * | 7/2005 | Kim .............................. | 257/288 |
| 2006/0022217 | A1 * | 2/2006 | Passlack ....................... | 257/192 |
| 2006/0197158 | A1 * | 9/2006 | Babcock et al. ............. | 257/351 |
| 2008/0017930 | A1 * | 1/2008 | Kim et al. ..................... | 257/369 |

(Continued)

*Primary Examiner* — Mamadou Diallo
*Assistant Examiner* — Jay C Chang

(57) ABSTRACT

A novel semiconductor transistor is presented. The semiconductor structure has a MOSFET like structure, with the difference that the device channel is formed in an intrinsic region, so as to effectively decrease the impurity and surface scattering phenomena deriving from a high doping profile typical of conventional MOS devices. Due to the presence of the un-doped channel region, the proposed structure greatly reduces Random Doping Fluctuation (RDF) phenomena decreasing the threshold voltage variation between different devices. In order to control the threshold voltage of the device, a heavily doped poly-silicon or metallic gate is used. However, differently from standard CMOS devices, a high work-function metallic material, or a heavily p-doped poly-silicon layer, is used for a n-channel device and a low work-function metallic material, or heavily n-doped poly-silicon layer, is used for a p-channel FET.

20 Claims, 11 Drawing Sheets

(56) References Cited

U.S. PATENT DOCUMENTS

2008/0067594 A1* 3/2008 Madurawe .................... 257/348
2010/0066430 A1* 3/2010 Siprak et al. .................. 327/379
2011/0074498 A1  3/2011 Thompson et al.

* cited by examiner

HIGH MOBILITY ENHANCEMENT MODE FET

BACKGROUND OF THE INVENTION

1. Field of the Invention

The present invention is in the field of semiconductor structures. The present invention is further in the field of semiconductor structures of transistor devices. The present invention further relates to the field of integrated devices and circuits. The implementation is not limited to a specific technology, and applies to either the invention as an individual component or to inclusion of the present invention within larger systems which may be combined into larger integrated circuits.

2. Brief Description of Related Art

The driving force for the semiconductor industry growth has been the elegant scaling nature of CMOS technology. This aggressive trend poses several technology and circuit design challenges. One such challenge is the expected increase in threshold voltage variation due to worsening Short Channel Effect (SCE) and Random Dopant Fluctuation (RDF).

Nevertheless, with proper control of the doping profile, the limit of CMOS scaling can be extended to 20-nm channel length without strict scaling of oxide thickness and power-supply voltage. An optimum design for 20-nm MOSFET calls for a vertically and laterally non-uniform doping profile, the super-halo, to control the short-channel effect. Halo doping, or non-uniform channel profile in the lateral direction, can be realized by angled ion implantation self-aligned to the gate, with a very restricted amount of diffusion. Retrograde doping, or vertically non-uniform doping profile instead is obtained by increasing the dopant concentration in the channel as it extends vertically downward (away from the gate toward the substrate).

The highly non-uniform profile sets up a higher effective doping concentration toward shorter devices, which counteracts short-channel effects. In terms of the threshold-voltage sensitivity to channel-length variations, the super-halo profile extends the scaling limit by a factor of nearly 2.

Even if this approach allows the reduction of SCE, it still requires to maintain a relatively high doping concentration in the channel region in order to obtain a positive threshold voltage and keep the leakage current under acceptable values. Therefore, super-halo profiles, or similar techniques (such as retrograde doping), do not eliminate issues related with random dopant density fluctuations, which can increase the threshold voltage variation to unacceptable levels.

Even if the fluctuations associated with lithographic dimensions and layer thicknesses are well controlled, random fluctuation of the relatively small number of dopants and their discrete microscopic arrangement in the channel of sub-0.1 µm MOSFET lead to significant variations in the threshold voltage and drive current. Such fluctuations may seriously affect the functionality, performance, and yield of the corresponding systems.

Another important limitation related to high channel doping is the degradation of the carrier mobility associated with the impurity scattering and quantum confinement phenomena that take place in the device channel. These phenomena reduce the drive current in the device heavily degrading the device performance.

In particular, in the area of power integrated circuits the silicon area occupied by the power transistors and their performance is more and more important in several applications. A very critical parameter for power transistors in integrated circuits is their specific $R_{DSon}$, measured in $\Omega*mm^2$. The silicon area is directly proportional to the cost of the integrated circuit and a low on-resistance is always desirable to increase the efficiency of the circuit and to reduce the power dissipation and therefore the temperature of the chip.

The most important Figure Of Merit (FOM) of a power transistor in specific power applications is the $R_{DSon}*Q$ of the transistor where $R_{DSon}$ is the on-resistance while Q is the charge associated with the gate capacitance (C*V). This FOM is directly associated with the time constant of the device. The lower the $R_{DSon}$ and the gate charge, the higher the achievable efficiency. In conventional CMOS technology, this FOM is independent from the silicon area since a lower $R_{DSon}$ deriving by an increase of the device size is generally correlated with an increase of the gate capacitance by the same amount.

Several prior art attempts to improve threshold control and at the same time increase carrier mobility, so as to effectively obtain low on-resistance components with high-yield have been documented. One example is reported in Terril et al. (U.S. Pat. No. 5,289,027), where an intrinsic channel SOI MOSFET with a buried oxide is described.

The advantage of the structure proposed in the cited prior art lie in the increase of the carrier mobility associated with the use of an intrinsic channel region. However, this advantage comes at the cost of an increase of the short channel effects, such as punch-through phenomena. In order to reduce such effects and increase the threshold voltage, the authors added a buried insulating layer and a back gate electrode under the channel region. This solution, even if very effective to reduce SCE, requires a much more complex and costly manufacturing process involving Silicon On Insulator technology, which is still quite expensive nowadays.

Other prior art attempts to improve the control on the carrier transport in the device so as to effectively obtaining low on-resistance components are reported in Takemura (U.S. Pat. No. 6,815,772), Mayer et al. (U.S. Pat. No. 5,497,019), and Hu et al. (U.S. Pat. No. 6,413,802). The general approach in the cited references is to add more control gate to the device in order to reduce short channel effects. This allows also the reduction of the channel doping and therefore an increase of the carrier mobility.

Also these examples, however, require Silicon On Insulator technology. A second problem is the alignment of the different gates of the device. Furthermore, since they are built on buried oxide, they cannot be used for power applications, since their capability to dissipate heat is very poor. Silicon dioxide, for example has a thermal conductivity that is about 100 times smaller than the one of Silicon.

Moreover, since their main objective is to enhance the control of the carrier transport, the thickness of the channel region must be lower than the maximum extension of the depletion region in the channel region, limiting the channel width in some configuration. Finally, since these devices operate in fully-depleted mode, they do not have the intrinsic body diodes typical of conventional bulk MOS devices. This characteristic limits the range of applications suitable for these technologies.

Another interesting prior art attempt to achieve higher carrier mobility and at the same time to reduce the threshold variation is described in Thompson et al. (US 2011/0074498). In this case a MOSFET device with an intrinsic channel is obtained using a non-uniform doping profile and the value of the threshold voltage is adjusted biasing the body of the MOSFET.

This configuration unfortunately is not practical, since it can be used only for an array of MOSFET connected all in parallel. Since the threshold voltage is adjusted varying the body voltage, each transistor not connected in parallel must be built in an isolated well adding to the silicon area and therefore to the cost of the solution.

Another prior art attempt to achieve higher current density for transistor devices is described in Tang et al. (U.S. Pat. No. 6,245,607). In this case an n-type buried channel MOSFET with a p+ poly-silicon gate is described. Also in this case the biasing of the substrate is used to dynamically adjust the threshold voltage at the desired value.

Unfortunately also this solution, suffers of the same drawbacks of the previous one, since the body voltage must differ between various devices. Furthermore, since the channel region has been n-doped, the RDF phenomena still causes high threshold voltage variation in the process flow.

Although the cited prior art references describe structures that present an enhanced carrier mobility, they are not very practical to be used in modern integrated circuits, where it is impossible to separately bias the body terminal of each device without increasing their leakage current and forming separated wells for each of them.

It is therefore a purpose of the present invention to describe a novel structure of a semiconductor transistor that offers the advantage of improving the carrier mobility and reducing the threshold voltage variation, without requiring expensive process modifications and/or dynamically varying the bias of the body terminal.

SUMMARY OF THE INVENTION

The present invention describes a transistor which has a MOSFET like structure, with the difference that the device channel is formed in an intrinsic region, so as to effectively decrease the impurity and surface scattering phenomena deriving from an high doping profile into the channel typical of conventional MOS devices. Due to the presence of the un-doped channel region, the proposed structure greatly reduces Random Dopant Fluctuation phenomena drastically decreasing the threshold voltage variation between different devices. In order to control the threshold voltage of the device, an heavily doped poly-silicon or metallic gate is used. However, differently from standard CMOS devices, a high work-function metallic material, or a heavily p-doped poly-silicon layer, is used for an n-channel device and a low work-function metallic material, or heavily n-doped poly-silicon layer, is used for a p-channel FET. Retrograde doping and/or halo implants are used in order to control the Short Channel Effects.

In order to better understand this concept, let us consider the structure illustrated in FIG. 1, which represents one of the embodiments of the present invention in CMOS technology. As it can be seen, conventional device terminals (source, gate and drain) are present. However the channel region under the gate oxide is made intrinsic (or near-intrinsic) allowing for an improvement of the carrier mobility.

The electrons in the channel are free to move with a reduced impurity scattering and their confinement at the channel surface is lowered, allowing for a notable improvement in the charge transport (since the transport becomes partially bulk, reducing the surface scattering phenomena).

Short channel effects are controlled by the use of a retrograde doping profile (or super-halo implants or a delta-doping implant), which allows the creation of a doped back-barrier, improving the confinement of the electrons in the intrinsic region under the gate-oxide so as to effectively inhibit undesired punch-through effects.

In first approximation, since the present invention proposes a channel substantially intrinsic with a doped back-barrier (or retrograde doping), the threshold voltage, differently from a conventional MOS device, can be expressed as (assuming $V_{BS}$ null)

$$V_T = \Phi_M - \chi_S - E_g/2 + |\phi_F| + \frac{1}{C_{ox}}\sqrt{2\varepsilon_s q N_B \left(2|\phi_F| + \frac{qN_B}{2\varepsilon_s}x_{ch}^2\right)} - \frac{qN_B}{C_{ox}}x_{ch}$$

where
$\varepsilon_s$ is the silicon dielectric constant,
$\Phi_M$ is the gate work-function,
$\chi_s$ is the channel electron affinity,
$E_g$ is the channel energy-gap,
$x_{ch}$ is the depth of the intrinsic channel layer,
$C_{ox}$ is the silicon dioxide capacitance,
$\phi_F$ is the built-in function of the substrate (or back-barrier),
and $N_B$ is the substrate (or back-barrier) doping.

In order to obtain a sufficiently positive threshold voltage, the work-function of the gate material must be therefore equal or greater than the sum of the electron affinity with half energy-gap. This result can be easily achieved using a heavily p-doped poly-silicon gate. Such choice increases the threshold voltage of the device, reducing the standby leakage current. Furthermore, due to the increase in carrier mobility, the drive current remains high even if the threshold voltage of the device results higher than in conventional MOS devices.

Polycrystalline silicon (poly-Si) indeed has been used as a MOSFET gate material for several decades. One of the primary reasons for this is its high compatibility with CMOS processing. Poly-Si can be very easily deposited by low pressure chemical vapor deposition (LPCVD) techniques and it displays excellent thermal stability on SiO2, which has been the gate dielectric of choice for MOSFETs. However, research over the last few years indicates an increasing use of metals and metal based gate stack materials for future CMOS devices.

If a metallic gate material is used, the threshold voltage can be engineered to the desired value using a metallic material with an appropriate work-function i.e., greater than the electron affinity plus half the energy-gap of the channel material for nMOS devices and lower than the electron affinity plus half the energy-gap for p-type MOS. As well known to anyone skilled in the art, also doped metallic materials, such as doped Molybdenum, can be used.

If needed, it is possible to utilize the same metallic material (e.g. tungsten) with a work function substantially equal to the electron affinity plus half the energy-gap of the channel material (e.g. about 4.6 eV for Si) for both nMOS and pMOS devices. This choice, however can be tolerated only if a low threshold values (around 0.2-0.3V) can be accepted. A fine tuning of the threshold voltage can be than obtained by varying the doping profile of the substrate.

The gate dielectric may include conventional dielectric materials such as oxides, nitrides and oxynitrides, or can be formed with higher dielectric constant dielectric materials, such as hafnium oxides, hafnium silicates, zirconium oxides, lanthanum oxides, titanium oxides, barium-strontium-titanates and lead-zirconate-titanates, metal based dielectric materials, and other materials. Preferred hafnium-containing oxides include $HfO_2$, $HfZrO_x$, $HfSiO_x$, $HfTiO_x$, $HfAlO_x$, and the like.

As mentioned above, the proposed structure greatly reduces the Random Dopant Fluctuation phenomena, drastically decreasing the threshold voltage variation between different devices. In first approximation the standard deviation in the threshold voltage, $\sigma V_T$, can be related to the retrograde doping concentration $N_B$ through the relation:

$$\sigma V_T = \frac{qt_{ox}}{\varepsilon_{ox}}\sqrt{\frac{N_B W_d}{3L_{eff} W_{eff}}\left(1-\frac{x_{ch}}{W_d}\right)^3} = [\sigma V_T]_{conv\_MOS}\sqrt{\left(1-\frac{x_{ch}}{W_d}\right)^3}$$

where $\varepsilon_{ox}$ is the permittivity of the gate oxide, $W_d$ is the width of the depletion layer under the gate, $W_{eff}$ and $L_{eff}$ are the effective width and length of the device channel, respectively.

There is therefore an extra term, $$\sqrt{\left(1-\frac{x_{ch}}{W_d}\right)^3} < 1,$$

with respect to the threshold voltage standard deviation of conventional MOS structures, $$[\sigma V_T]_{conv\_MOS} = \frac{qt_{ox}}{\varepsilon_{ox}}\sqrt{\frac{N_B W_d}{3L_{eff} W_{eff}}},$$

which leads to a great reduction of the threshold voltage sensibility to the process parameters.

In general, the use of a substantially un-doped channel region can also enhance the effectiveness of certain conventional techniques often used to improve transistor performance. For example, the source and drain regions can be structured to modify stress applied in the channel region. Alternatively, the channel region can be modified by lattice matched and strained silicon germanium (SiGe) crystalline thin film lattice placed to cause a compressive strain in an in-plane direction of the channel. This causes changes in band structure such that hole mobility increases as compared with intrinsic Si. Stress conditions can be modified by changing germanium (Ge) composition (higher Ge increases strain and the hole mobility becomes higher).

For tensile strain, the Si channel region can be formed on lattice-relaxed SiGe having a greater lattice constant. This results in both the electron mobility and the hole mobility increasing as compared with unstrained Si channel regions. Also in this case, as germanium composition of the base SiGe is increased, the amount of the strain in the strained Si channel region and the carrier mobilities tend to increase. Due to the reduced scattering and confinement effects, stress enhanced mobility is significantly larger than in a conventional device.

As shown in FIG. 2, many doping profiles can be used in order to improve the control on the threshold voltage and minimize the short channel effects. For example a heavily p-doped region 15 can be formed under the intrinsic channel region 16 in order to further increase the carrier confinement in the channel region and minimize Drain Induced Barrier Lowering or Punch-through phenomena. Alternatively, a super halo profile involving a non-uniform doping across the vertical direction, can be also used. The high doped region can be extended also under the source and drain regions in case the application requires a low resistance parasitic diode included in the device.

Another interesting doping profile is shown in FIG. 3, where also the doping under the source and drain regions has been made not-uniform. In this case, the intrinsic layer under the n+ regions decreases the parasitic capacitance and the leakage current associated with these junctions, notably improving the device performance.

A variant of the previous structure is shown in FIG. 4, where the region 34 under the intrinsic layer 35 has been doped heavier than the substrate 33 in order to further increase the carrier confinement in the channel. This extra layer reduces short channel effects, decreasing at the same time the resistance associated with the body diode.

Another interesting doping profile is shown in FIG. 5, where two p+ halo 44 and 46 have been formed at the S/D junctions, and two Lightly-Doped Diffusion (LDD) regions 41 and 49 have been added at the surface. As well known to anyone skilled in the art, LDD regions and/or p+ halo implants can be added to anyone of the embodiments of the present invention.

A slightly different configuration is shown in FIG. 6, where the halo implants 56 and 59 surround almost completely the source and drain regions 55 and 60. This configuration allows a great reduction of the SCE without increasing the parasitic capacitance associated to the drain and source regions. As well known to anyone skilled in the art, many other doping profiles can be used in order to improve the device performance.

In FIG. 7 the preferred embodiment of the present invention is shown, where the source and drain region 68 and 73 are raised with respect to the intrinsic channel layer. This configuration can be obtained, for example, forming the gate 65 and its dielectric 69 recessed into the channel or by growing selective epitaxial silicon layers in the source and drain regions of the MOSFET device after the sidewall spacer (66 and 75) creation. This configuration is very effective in reducing the SCE, maintaining a very low contact resistance for the drain and source regions. The heavily p-doped layer 71 under the intrinsic channel operates as a barrier for the carriers, improving their confinement into the intrinsic channel. This layer is optional and its use depends on the doping level of the substrate 70. Furthermore, it can be substituted with a super halo profile or other doping profiles.

The present invention can be realized also with a bulk (i.e. not SOI) tri-gate/finFET structure as illustrated in FIG. 8, where the gate 76 and the oxide layer 84 have been slightly separated in order to better show the device structure. In this case, since the multi-channel configuration increases the control on the carrier transport, the use of an intrinsic channel combined with a high work-function gate material, results in an even higher control on the device performance.

Another interesting configuration is shown in FIG. 9, where the gate itself is used to control the short channel effects in a bulk tri-gate/finFET structure. In this embodiment, two intrinsic regions 88 and 87 have been added under the source and drain regions 90 and 86, in order to confine the SCE effects in the upper part of the tridimensional fin, where the gate has a strongest influence. Also in this case, the gate 85 and the oxide layer 92 have been slightly separated in order to better show the device structure.

The previous concept can be applied also to bulk double gate devices as shown in FIG. 10, where a multi-finger double gate device in agreement with a further embodiment of the present invention is shown. In this embodiment, all the fingers are connected in parallel, allowing for an increase of the drive current in the device, and each gate region is used to control two separate fingers, so as to effectively increase the control on the carrier transport.

In FIG. 11 are shown the drain voltage waveforms resulting by the numerical simulation of a conventional n-channel MOS and a MOS device according to the embodiment of FIG. 3. A resistive load was placed between the drain and a supply voltage of 2V and a pulse voltage signal varying between 0 and 2V has been applied to the gate terminal. In this analysis the load resistance used was 0.1 Ohms. Both devices have a channel width of 50 mm, and a gate length of 0.2 μm. The gate of the device according to the present invention has been made metallic and its work-function has been adjusted in order to achieve the same threshold voltage of the conventional MOS (about 0.7V).

As it can be seen, the increase of carrier mobility in the present invention (solid line 100) allows an improvement of about 53% in the on-resistance with respect to the conventional MOS (dashed line 99).

For all the MOS structures described above, also the equivalent p-channel version can be obtained by simply substituting the n-doped regions with p-type regions and vice versa, and using a low work-function material (i.e. e metallic material with a work-function lower than the one of the channel region or a heavily n-doped poly-silicon layer). In general, the channel layer can be also low-doped ($<1e16\ cm^{-3}$) with p- or n-type impurities (independently from the conductivity type of the device channel) in order to tune the threshold voltage (e.g. a n-doping can be used for lowering the threshold voltage in a n-channel MOS, whereas a p-doping type can be used to increase the threshold voltage), without degrading too much the device characteristics.

Most of the device structure described above can be obtained by means of standard CMOS manufacturing processes. If desired, the intrinsic channel layer can be grown through an epitaxial process step in order to minimize the level of doping impurities. The other process steps (implantations, gate oxide thermal growth, and gate deposition) remain almost unchanged with respect to a conventional CMOS process technology. This makes the present invention very cost attractive.

It is therefore an object of the present invention to increase the carrier mobility and to reduce the device parasitic capacitance by utilizing an intrinsic channel combined with a high work-function gate material in case of n-channel FET and a low work-function gate material in case of p-channel FET.

As is clear to those skilled in the art, this basic system can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
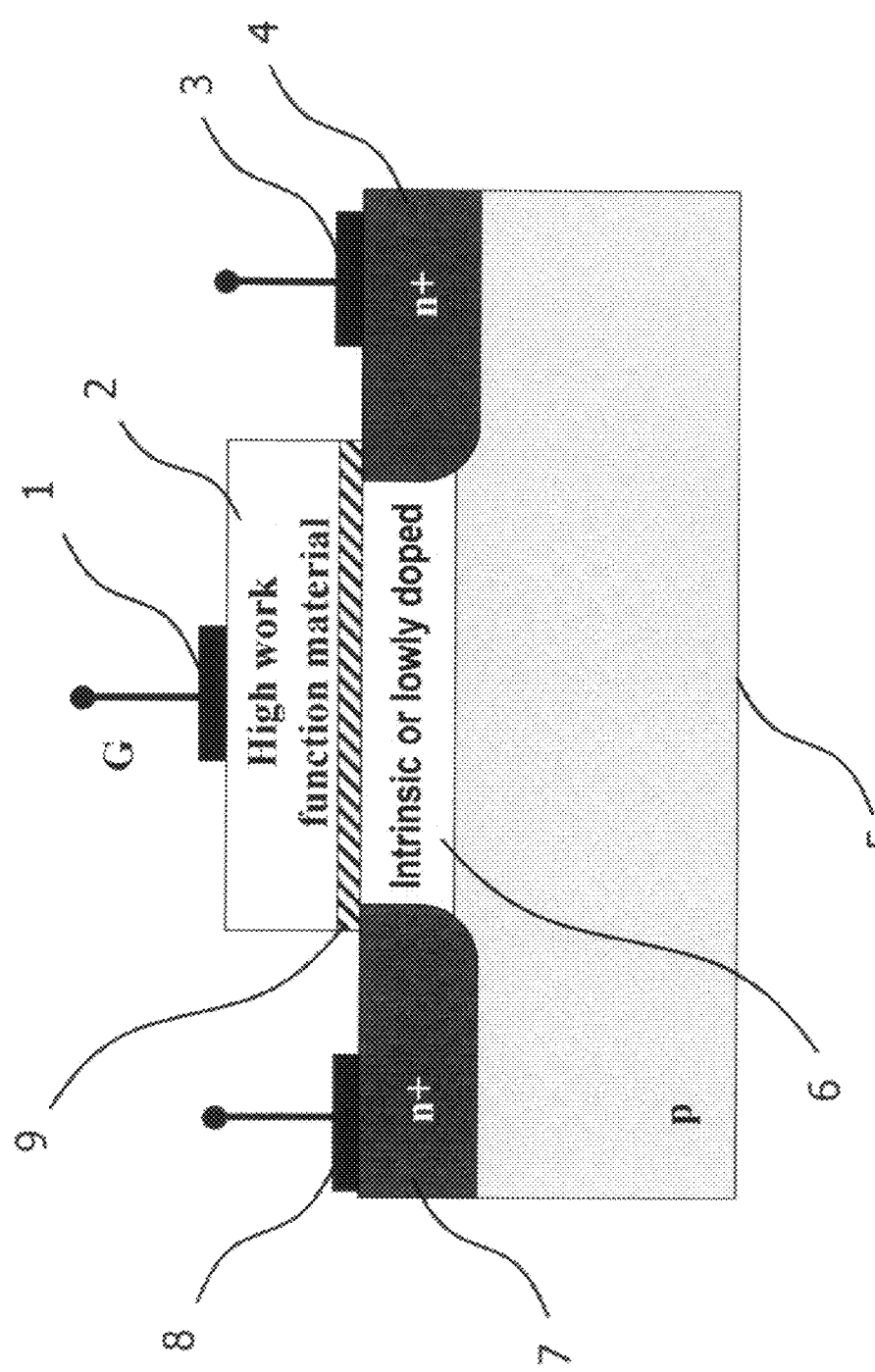
FIG. 1 shows a cross section view of a FET device according to the first embodiment of the invention.

FIG. 1 is showing the first general embodiment of the invention. Regions 4 and 7, which can be made in n+-type semiconductor or metal, define the drain and the source of the transistor. The region 9 corresponds to the gate-oxide, and the region 5 is the p-type substrate of the device. The gate electrode 2, which can be built in metal or poly-silicon, forms the gate of the transistor. As it can be seen, differently from a conventional MOS device where the channel region is p-doped and the gate is made in n+-doped poly-silicon or with a low work-function metallic material, the channel region 6 of this embodiment is kept intrinsic, and the gate 2 is formed with a high work-function material.

The present invention therefore defines a MOS device with a higher carrier mobility, which leads to a significant improvement of the device performance. Since the channel region is substantially un-doped, the impurity scattering and the surface roughness scattering phenomena are greatly reduced.

The un-doped channel also minimizes Random Dopant Fluctuation phenomena, greatly reducing the threshold voltage variation across different devices due to the manufacturing process. This is a very important characteristic, since, in certain applications, it allows the reduction of the device dimensions and therefore of the cost associated with the final IC.

Short channel effects are controlled by the use of a retrograde doping profile (or super-halo implants or a delta-doping implant), which allows the creation of a doped back-barrier, improving the confinement of the electrons in the intrinsic region under the gate-oxide so as to effectively inhibit undesired punch-through effects.

In order to obtain a sufficiently positive threshold voltage, the work-function of the gate material must be therefore equal or greater than the sum of the electron affinity with half energy-gap. This result can be easily achieved using a heavily p-doped poly-silicon gate. Such choice increases the threshold voltage of the device, reducing the standby leakage current. Furthermore, due to the increase in carrier mobility, the drive current remains high even if the threshold voltage of the device results higher than in conventional MOS devices.

Alternatively, a metallic material can be used for the gate. In this case, the threshold voltage can be engineered to the desired value using a metallic material with an appropriate work-function i.e., greater than the electron affinity plus half the energy-gap of the channel material for nMOS devices and lower than the electron affinity plus half the energy-gap for p-type MOS. As well known to anyone skilled in the art, also doped metallic materials, such as doped Molybdenum, can be used.

If needed, it is possible to utilize the same metallic material (e.g. tungsten) with a work function equal to the electron affinity plus half the energy-gap of the channel material (e.g. about 4.6 eV for Si) for both nMOS and pMOS devices. This choice, however can be tolerated only if a low threshold values (around 0.2-0.3V) can be accepted. A fine tuning of the threshold voltage can be than obtained by varying the doping profile of the substrate.

The gate dielectric may include conventional dielectric materials such as oxides, nitrides and oxynitrides, or can be formed with higher dielectric constant dielectric materials, such as hafnium oxides, hafnium silicates, zirconium oxides, lanthanum oxides, titanium oxides, barium-strontium-titanates and lead-zirconate-titanates, metal based dielectric materials, and other materials. Preferred hafnium-containing oxides include $HfO_2$, $HfZrO_x$, $HfSiO_x$, $HfTiO_x$, $HfAlO_x$, and the like.

Provision for a transistor having a substantially un-doped channel brings other advantages when stress is applied. For example, stress may be applied by compressive or tensile stress applied via the source/drain or channel stress techniques (involving SiGe alloys). As compared to conventional nanoscale transistors with uniformly or highly doped channels, a strained channel region FET transistor will provide a larger strain enhanced mobility due to the low concentrations of dopants near the gate dielectric (reduced ionized impurity scattering) and the lower electric field (reduced surface roughness scattering). Due to the reduced scattering, stress enhanced mobility will be significantly larger than in a conventional device.

B FIG. 2

Figure 2:
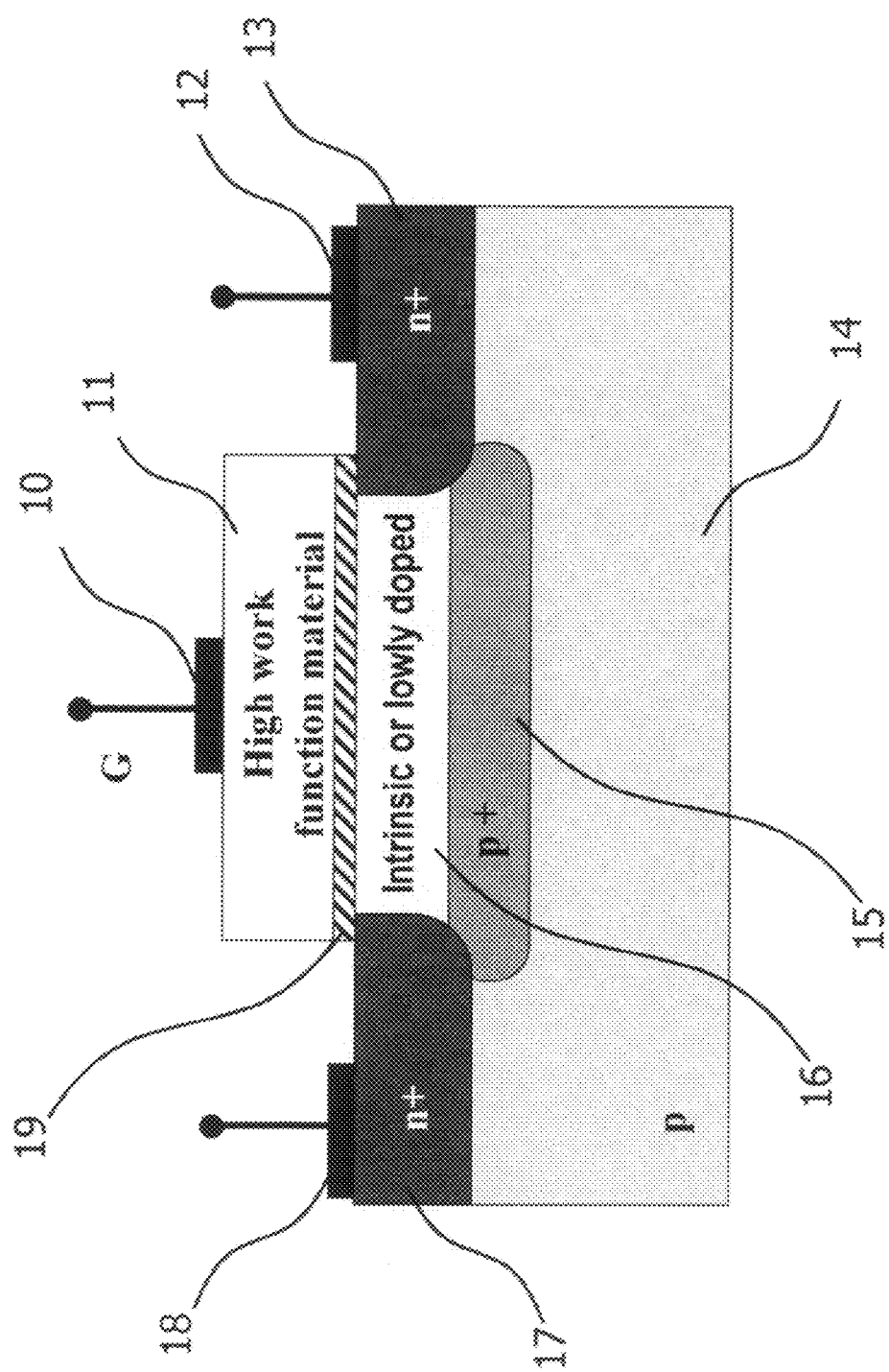
FIG. 2 shows a cross section view of a FET device according to a further embodiment of the invention, where a heavily doped region has been added under the intrinsic region.

As shown in FIG. 2, many doping profiles can be used in order to improve the control on the threshold voltage and minimize the short channel effects. For example a heavily p-doped region 15 can be formed under the intrinsic channel region 16 in order to further increase the carrier confinement in the channel region and minimize Drain Induced Barrier Lowering or Punch-through phenomena. Alternatively, a super halo profile involving a non-uniform doping across the vertical direction, can be also used. The high doped region can be extended also under the source and drain regions in case the application requires a low resistance parasitic body diode included in the device.

C FIG. 3

Figure 3:
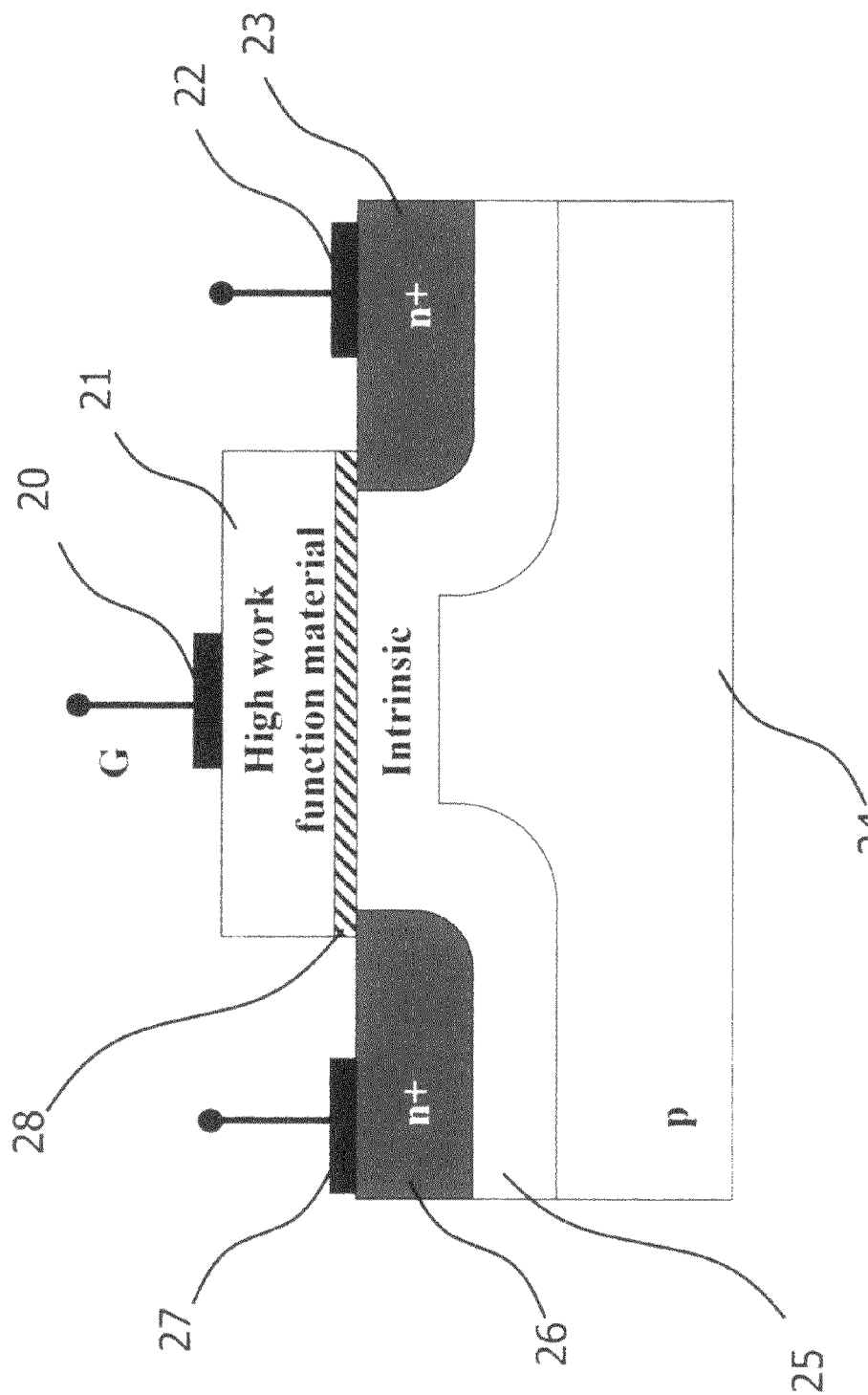
FIG. 3 shows a cross section view of a FET device according to a further embodiment of the invention, where a not-uniform doping profile has been used also under the drain and source regions.

Another interesting doping profile is shown in FIG. 3, where the non-uniform doping profile has been extended also under the source and drain regions 23 and 26. In this case, the intrinsic layer 25 under the n+ regions 23 and 26 decreases the parasitic capacitance and the leakage current associated with these junctions, notably improving the device performance.

D FIG. 4

Figure 4:
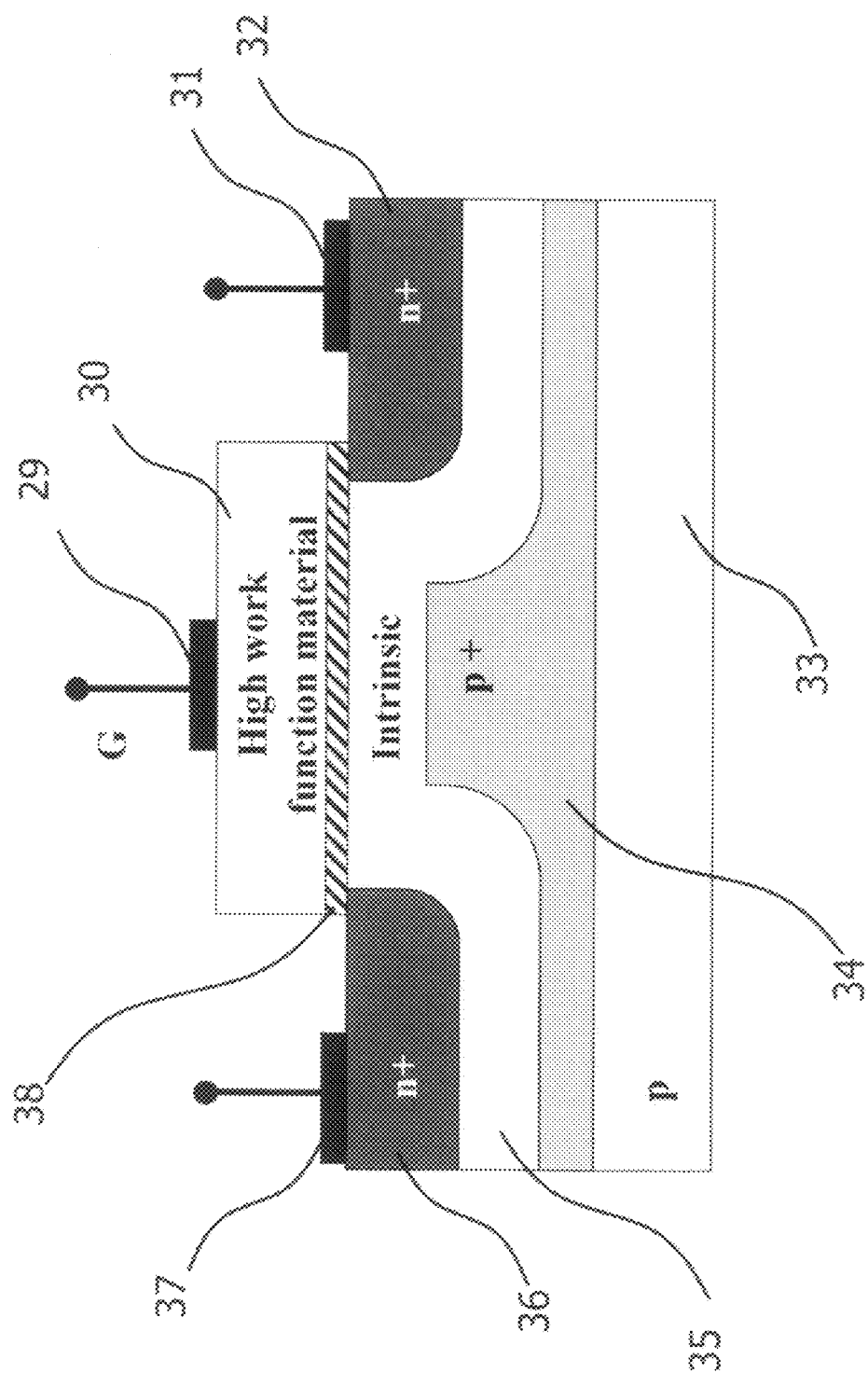
FIG. 4 shows a cross section view of a FET device according to a further embodiment of the invention, where a not-uniform doping profile has been used also under the drain and source regions and a heavily doped region has been added under the channel region.

A variant of the previous structure is shown in FIG. 4, where the region 34 under the intrinsic layer has been doped more heavily than the substrate 33 in order to further increase the carriers confinement in the channel. This extra layer reduces short channel effects, decreasing, at the same time, the resistance of the body contact.

E FIG. 5

Figure 5:
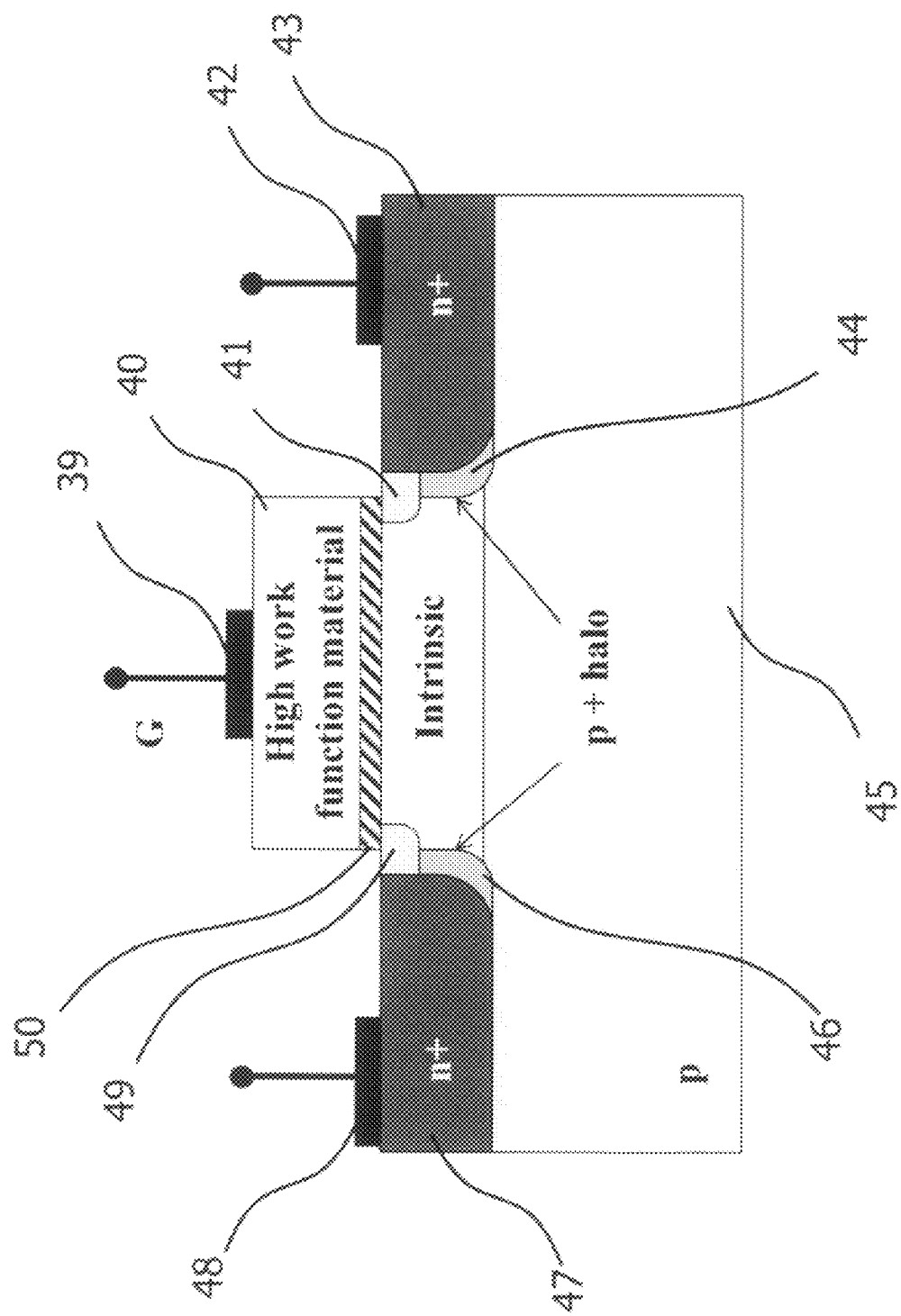
FIG. 5 shows a cross section view of a FET device according to a further embodiment of the invention, where two p+ halo and two LDD regions have been added to the structure.

Another interesting doping profile is shown in FIG. 5, where two p+ halo 44 and 46 have been formed at the S/D junctions, and two Lightly-Doped Diffusion (LDD) regions 41 and 49 have been added at the surface. As well known to anyone skilled in the art, LDD regions and/or p+ halo implants can be also added to any of the embodiments of the present invention.

F FIG. 6

Figure 6:
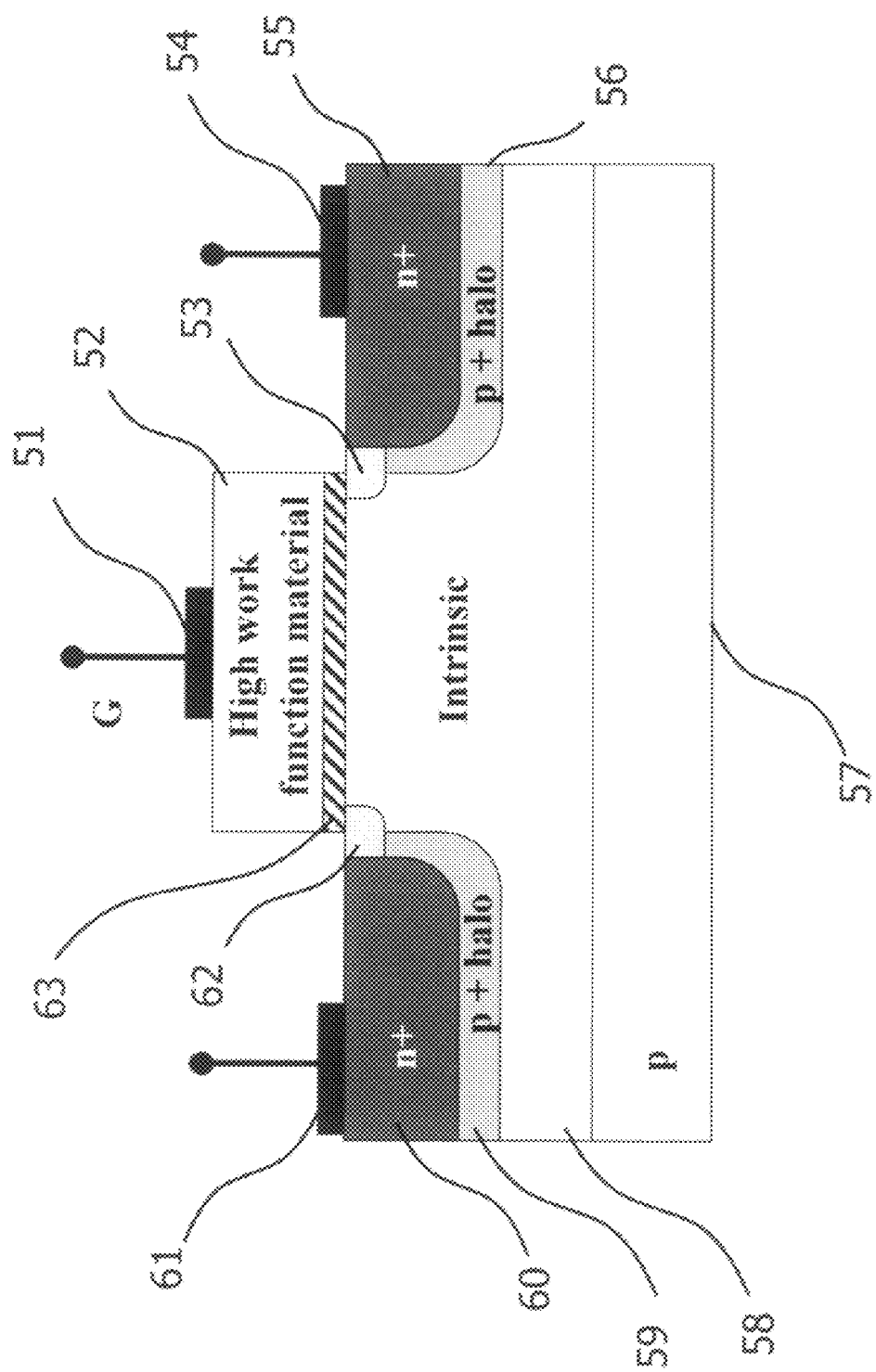
FIG. 6 shows a cross section view of a FET device according to a further embodiment of the invention, where two p+ halo surrounding almost completely the source and drain regions, have been added to the structure.

A slightly different configuration is shown in FIG. 6, where the halo implants 56 and 59 surround almost completely the source and drain regions 55 and 60. This configuration allows a great reduction of the SCE without increasing the parasitic capacitance associated to the drain and source regions. As well known to anyone skilled in the art, many other doping profiles can be used in order to improve the device performance.

G FIG. 7

Figure 7:
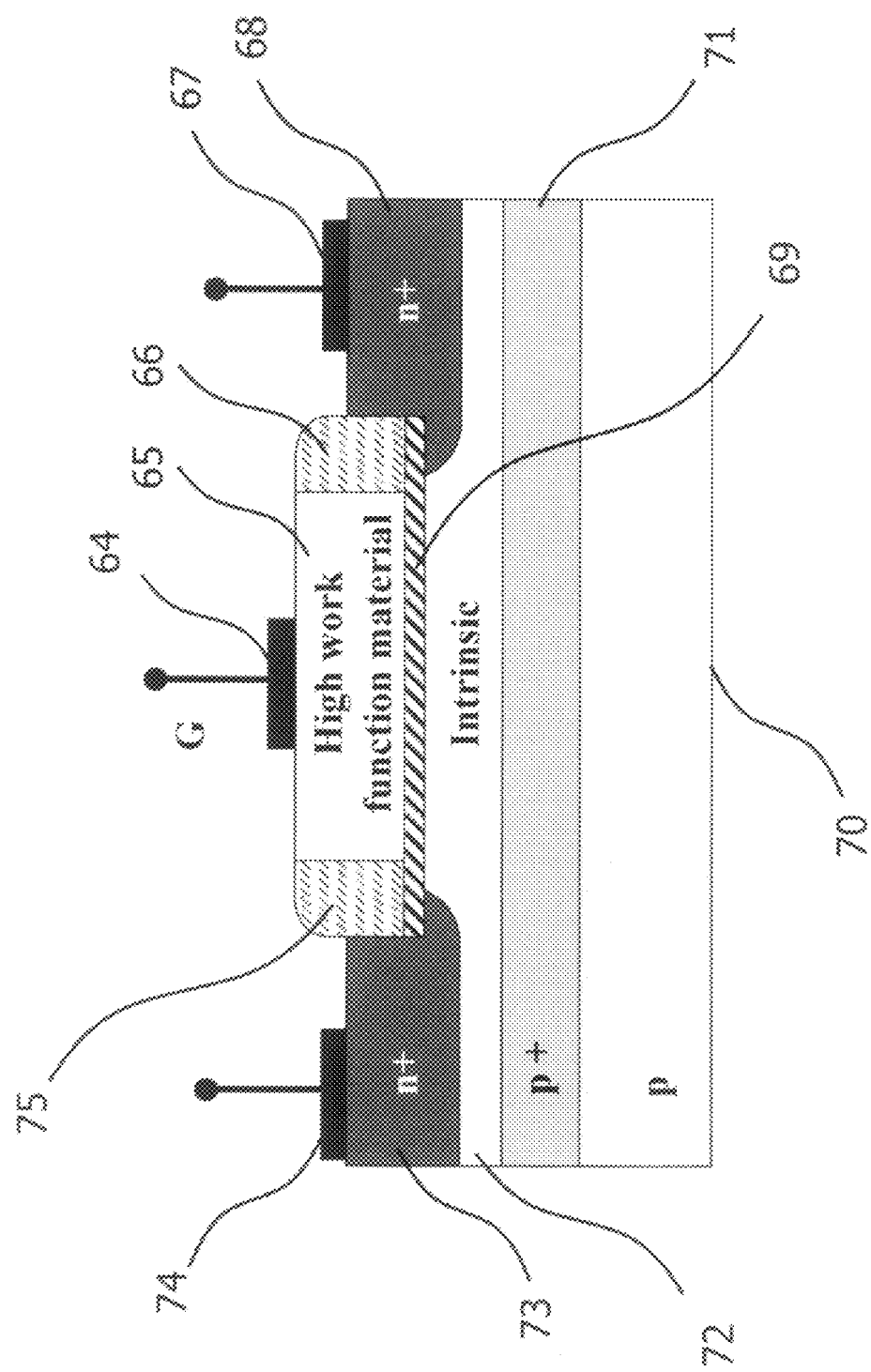
FIG. 7 shows a cross section view of a FET device according to the preferred embodiment of the invention, where the source and drain regions are raised with respect to the channel layer.

In FIG. 7 the preferred embodiment of the present invention is shown, where the source and drain region 68 and 73 are raised with respect to the intrinsic channel layer. This configuration can be obtained, for example, forming the gate 65 and its dielectric 69 recessed into the channel or by growing selective epitaxial silicon layer in the source and drain regions of the MOSFET device after the sidewall spacer (66 and 75) creation. This configuration is very effective in reducing the SCE, maintaining a very low contact resistance for the drain and source regions. The heavily p-doped layer 71 under the intrinsic channel operates as a barrier for the carriers, improving their confinement into the intrinsic channel. This layer is optional and its use depends on the doping level of the substrate 70. Furthermore, it can be substituted with a super halo profile or other doping profiles.

H FIG. 8

Figure 8:
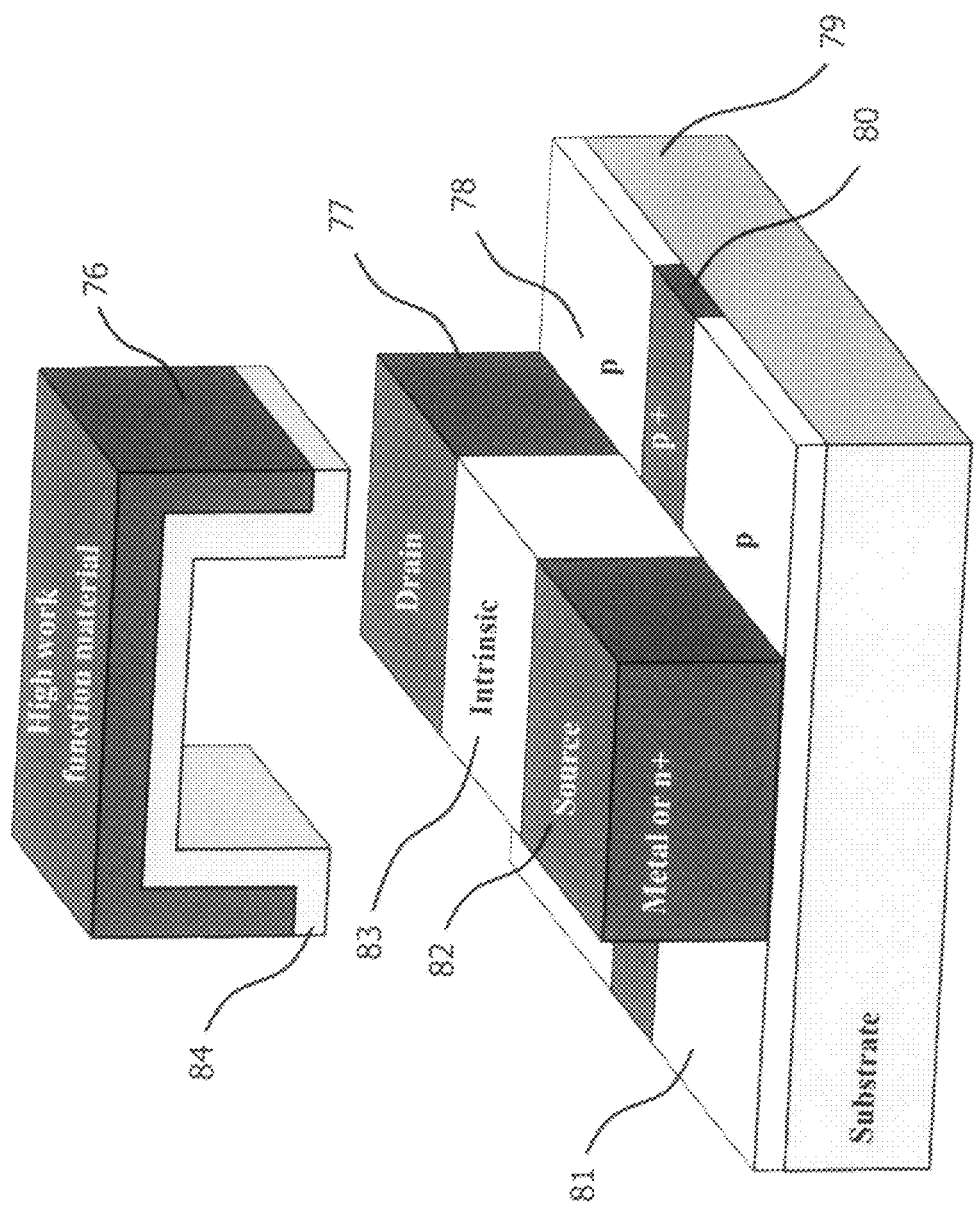
FIG. 8 shows a 3D view of a FET device according to a further embodiment of the invention, where a bulk (i.e. not SOI) tri-gate/finFET structure has been adopted in order to improve the control on the carrier transport.

The present invention can be realized also with a bulk (i.e. not SOI) tri-gate/finFET structure as illustrated in FIG. 8, where the gate 76 and the oxide layer 84 have been slightly separated in order to better show the device structure. In this case, since the multi-channel configuration increases the control on the carrier transport, the use of an intrinsic channel combined with a high work-function gate material, results in an even higher control on the device performance.

I FIG. 9

Figure 9:
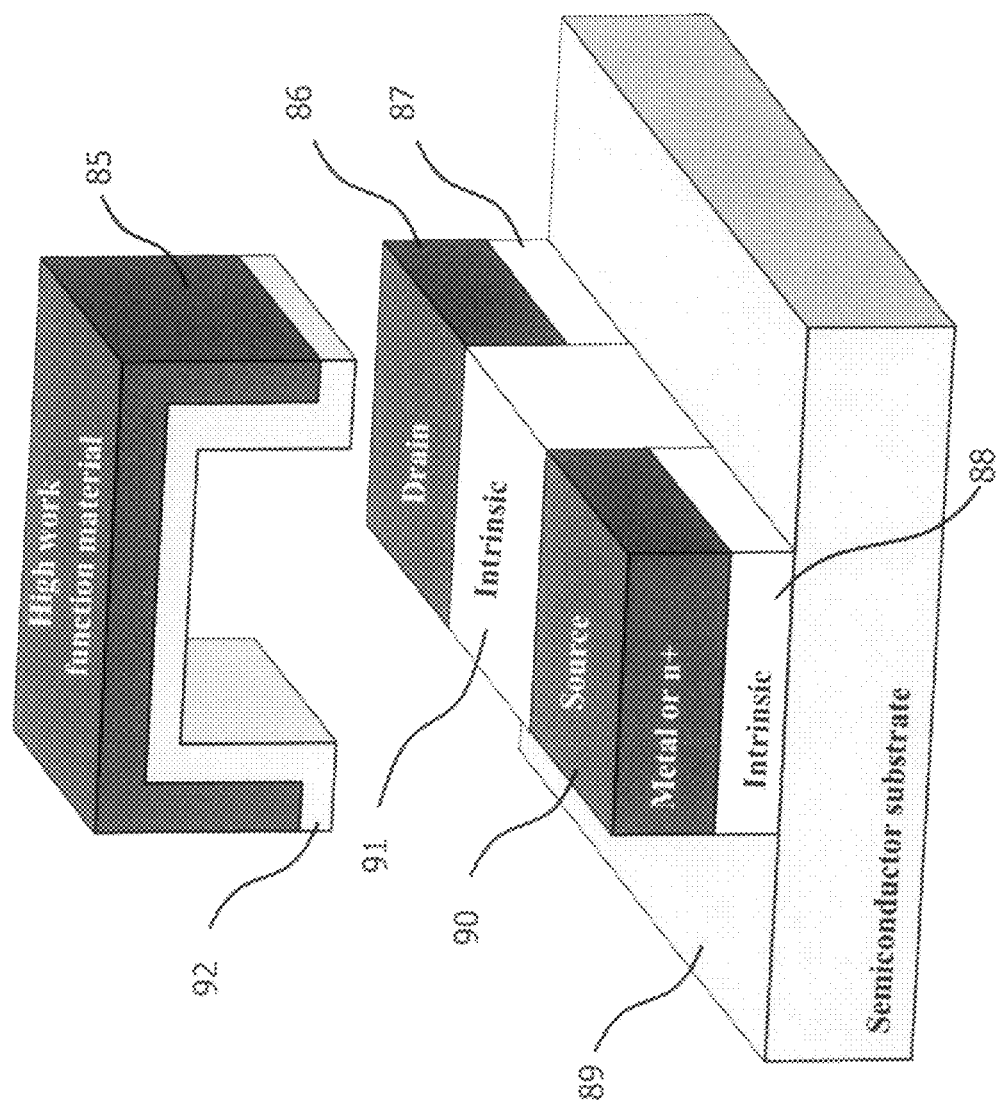
FIG. 9 shows a 3D view of a FET device according to a further embodiment of the invention, where two intrinsic regions have been added under the source and drain contact of a bulk tri-gate/finFET structure in order to improve the control on the short channel effects.

Another interesting configuration is shown in FIG. 9, where the gate itself is used to control the short channel effects in a bulk tri-gate/finFET structure. In this embodiment, two intrinsic regions 88 and 87 have been added under the source and drain regions 90 and 86, in order to confine the SCE effects in the upper part of the tridimensional fin, where the gate has a strongest influence. Also in this case, the gate 85 and the oxide layer 92 have been slightly separated in order to better show the device structure.

J FIG. 10

Figure 10:
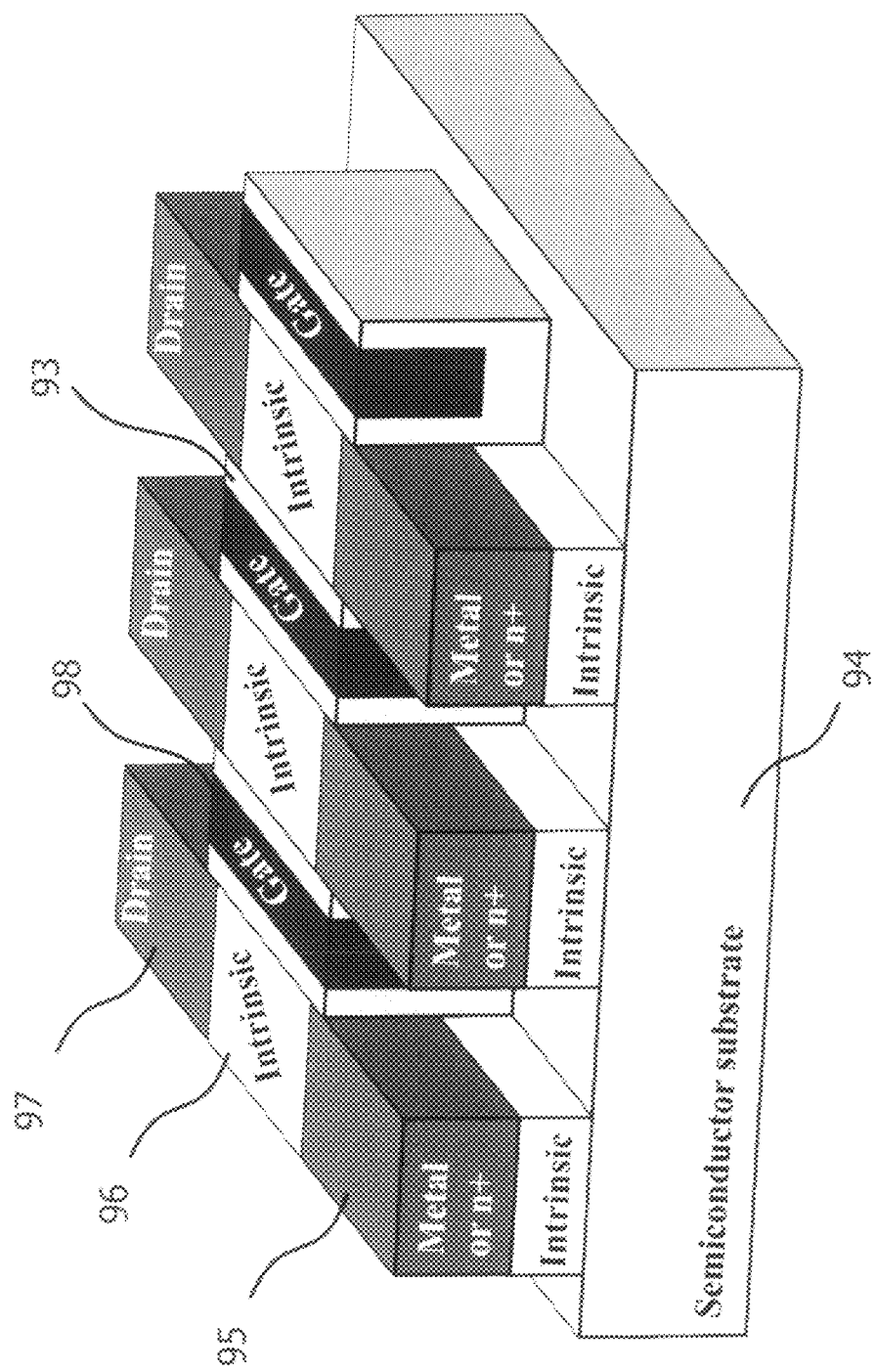
FIG. 10 shows a 3D view of a bulk multi-finger double-gate structure according to a further embodiment of the invention.

The previous concept can be applied also to bulk double gate devices as shown in FIG. 10, where a multi-finger double gate device in agreement with a further embodiment of the present invention is shown. In this embodiment, all the fingers are connected in parallel, allowing for an increase of the drive current in the device, and each gate region is used to control two separate fingers, so as to effectively increase the control on the carrier transport.

K FIG. 11

Figure 11:
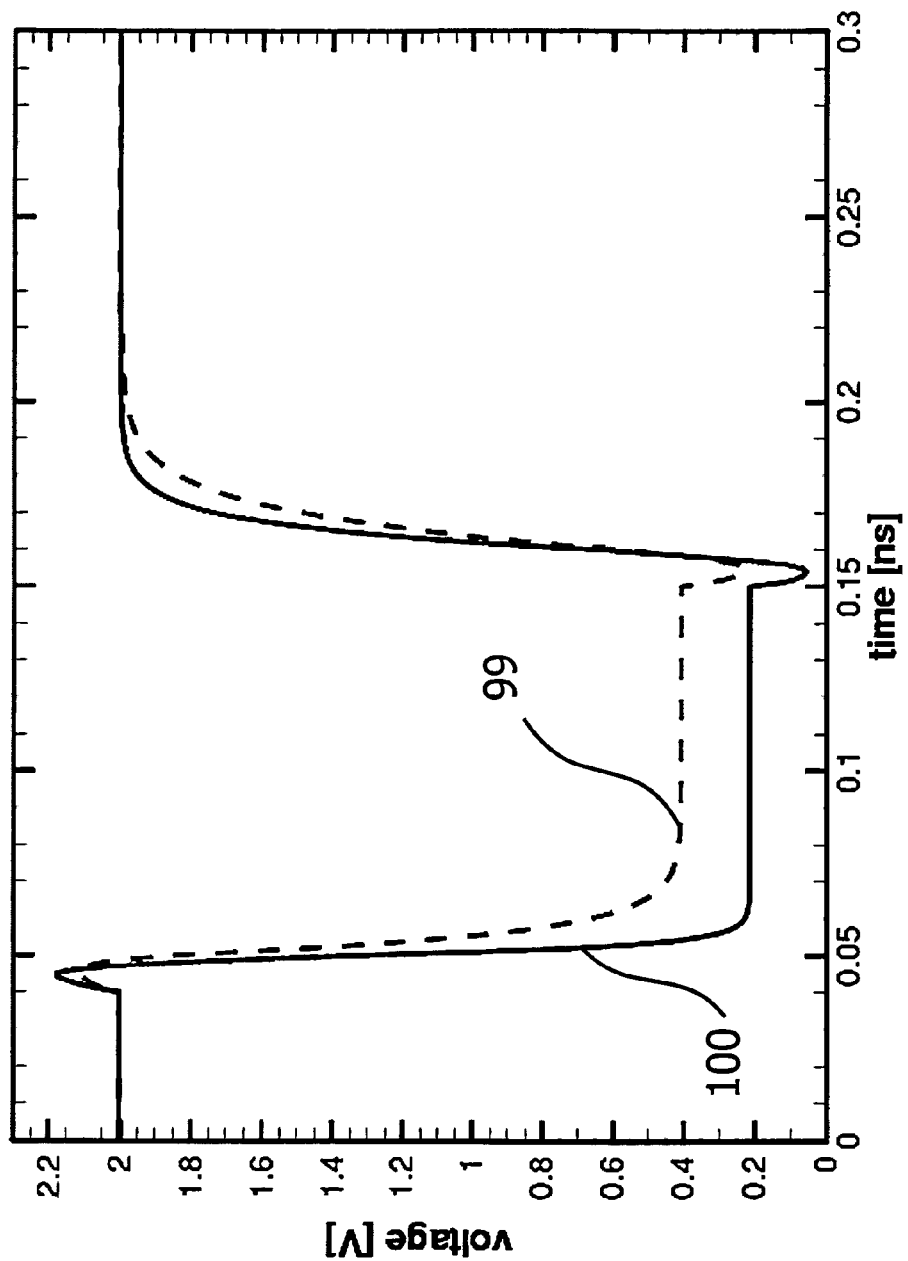
FIG. 11 shows the drain voltage waveforms resulting by the numerical simulation of a conventional n-channel MOS and a MOS device according to the embodiment of FIG. 3.

In FIG. 11 are shown the drain voltage waveforms resulting by the numerical simulation of a conventional n-channel MOS and a MOS device according to the embodiment of FIG. 3. A resistive load was placed between the drain and a supply voltage of 2V and a pulse voltage signal varying between 0 and 2V has been applied to the gate terminal. In this analysis the load resistance used was 0.1 Ohms. Both devices have a channel width of 50 mm, and a gate length of 0.2 µm. The gate of the device according to the present invention has been made metallic and its work-function has been adjusted in order to achieve the same threshold voltage of the conventional MOS (about 0.7V).

As it can be seen, the increase of carrier mobility in the present invention (solid line 100) allows an improvement of about 53% in the on-resistance with respect to the conventional MOS (dashed line 99).

For all the MOS structures described above, also the equivalent p-channel version can be obtained by simply substituting the n-doped regions with p-type regions and vice versa, and using a low work-function gate material (i.e. e metallic material with a work-function lower than the one of the channel region or a heavily n-doped poly-silicon layer). In general, the channel layer can be also low-doped (<1e16 cm$^{-3}$) with p- or n-type impurities (independently from the conductivity type of the device channel) in order to tune the threshold voltage (e.g. a n-doping can be used for lowering the threshold voltage in a n-channel MOS, whereas a p-doping type can be used to increase the threshold voltage), without degrading too much the device characteristics.

Most of the device structure described above can be obtained by means of standard CMOS manufacturing processes. If desired, the intrinsic channel layer can be grown through an epitaxial process step in order to minimize the level of doping impurities. The other process steps (implantations, gate oxide thermal growth, and gate deposition) remain almost unchanged with respect to a conventional CMOS process technology. This makes the present invention very cost attractive.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor field effect device structure comprising:
    a source region and a drain region;
    a channel region between said source and drain regions;
    a semiconductor barrier region under said channel region;
    a dielectric layer extending over at least a portion of said channel region;
    a gate extending over said dielectric layer;
        wherein said gate is in physical contact with said dielectric layer;
        wherein said gate is at least partially overlapped with at least one of said source and drain regions;
        wherein said channel region has a dopant concentration less than about $5\times10^{16}$ cm$^{-3}$;
        wherein said gate has a work-function substantially equal or greater than the sum of the electron affinity and half energy-gap of said channel region, when said semiconductor field effect device is a n-channel device;
        wherein said gate has a work-function substantially equal or lower than the sum of the electron affinity and half energy-gap of said channel region, when said semiconductor field effect device is a p-channel device, and
        wherein said semiconductor field effect device structure is an enhancement mode field effect device.

2. The structure of claim 1, wherein said gate is formed with a material belonging to the group comprising semiconductor and metallic materials.

3. The structure of claim 1, wherein said semiconductor barrier region is a doped region;
    wherein said semiconductor barrier region is doped with p-type impurities, when said semiconductor field effect device is a n-channel device, and
    wherein said semiconductor barrier region is doped with n-type impurities, when said semiconductor field effect device is a p-channel device.

4. The structure of claim 1, wherein the doping of said channel region is not uniform.

5. The structure of claim 1, wherein said channel region is a first substantially intrinsic semiconductor region, and wherein a second substantially intrinsic semiconductor region is present under at least one of said source and drain regions.

6. The structure of claim 1, wherein said semiconductor field effect device structure has a bulk multi-gate structure.

7. The structure of claim 1, wherein said source and drain regions are raised with respect to said channel region.

8. The structure of claim 1, wherein said channel region has a work-function substantially equal to the sum of the electron affinity and half energy-gap of a semiconductor material forming said channel region.

9. A method for forming a semiconductor field effect device structure comprising:
    forming a source and a drain region;
    forming a dielectric layer by means of deposition or thermal growth process steps, extending over at least a portion of a channel region comprised between said source and drain regions;
    forming a gate by means of deposition of metal or semiconductor material extending over at least a portion of said dielectric layer;
        wherein said gate is in physical contact with said dielectric layer;
        wherein said gate is at least partially overlapped with at least one of said source and drain regions;
        wherein a semiconductor barrier region is present under said channel region;
        wherein said gate has a work-function substantially equal or greater than the sum of the electron affinity and half energy-gap of said channel region, when said semiconductor field effect device is a n-channel device;
        wherein said gate has a work-function substantially equal or lower than the sum of the electron affinity and half energy-gap of said channel region, when said semiconductor field effect device is a p-channel device, and
        wherein said semiconductor field effect device structure is an enhancement mode field effect device.

10. The method of claim 9, wherein said gate is formed with a material belonging to the group comprising semiconductor and metallic materials.

11. The method of claim 9, wherein said semiconductor barrier region is a highly doped region having a dopant concentration greater than about $5\times10^{17}$ cm$^{-3}$;
    wherein said semiconductor barrier region is doped with p-type impurities, when said semiconductor field effect device is a n-channel device, and
    wherein said semiconductor barrier region is doped with n-type impurities, when said semiconductor field effect device is a p-channel device.

12. The structure of claim 1, wherein said channel region comprises a substantially intrinsic region and a retrograded doped region.

13. The structure of claim 1 wherein said semiconductor barrier region is a highly doped region having a dopant concentration greater than about $5\times10^{17}$ cm$_{-3}$;
   wherein said semiconductor barrier region is doped with p-type impurities, when said semiconductor field effect device is a n-channel device, and
   wherein said semiconductor barrier region is doped with n-type impurities, when said semiconductor field effect device is a p-channel device.

14. The structure of claim 1, wherein said channel region has the same conductivity type of said source and drain regions.

15. The structure of claim 1, wherein said channel region is a substantially intrinsic semiconductor region.

16. The structure of claim 1, wherein said semiconductor barrier region is a doped region having a doping profile belonging to the group comprising retrograde doping, halo, super-halo, and delta-doping profiles.

17. The method of claim 9, wherein said channel region has a work-function substantially equal to the sum of the electron affinity and half energy-gap of the semiconductor material forming said channel region.

18. The structure of claim 1, wherein said channel region is formed by means of a semiconductor epitaxial growth process step.

19. A semiconductor field effect device structure comprising:
   a source region and a drain region;
   a channel region between said source and drain regions;
   a semiconductor barrier region under said channel region;
   a dielectric layer extending over at least a portion of said channel region;
   a gate extending over said dielectric layer;
      wherein said gate is in physical contact with said dielectric layer;
      wherein said gate is at least partially overlapped with at least one of said source and drain regions;
      wherein said gate has a work-function substantially equal or greater than the sum of the electron affinity and half energy-gap of said channel region when said semiconductor field effect device is a n-channel device;
      wherein said gate has a work-function substantially equal or lower than the sum of the electron affinity and half energy-gap of said channel region, when said semiconductor field effect device is a p-channel device, and
   wherein said semiconductor field effect device structure is an enhancement mode field effect device.

20. The structure of claim 19, wherein said channel region has a work-function substantially equal to the sum of the electron affinity and half energy-gap of a semiconductor material forming said channel region.

* * * * *